(12) United States Patent
Partsch (10) Patent No.: US 12,135,901 B2
(45) Date of Patent: Nov. 5, 2024

(54) JOINT COMMAND DYNAMIC RANDOM ACCESS MEMORY (DRAM) APPARATUS AND METHODS

(71) Applicant: Rambus Inc., San Jose, CA (US)

(72) Inventor: Torsten Partsch, San Jose, CA (US)

(73) Assignee: Rambus Inc., San Jose, CA (US)

( * ) Notice: Subject to any disclaimer, the term of this patent is extended or adjusted under 35 U.S.C. 154(b) by 99 days.

(21) Appl. No.: 17/637,724

(22) PCT Filed: Aug. 25, 2020

(86) PCT No.: PCT/US2020/047850
§ 371 (c)(1),
(2) Date: Feb. 23, 2022

(87) PCT Pub. No.: WO2021/041445
PCT Pub. Date: Mar. 4, 2021

(65) Prior Publication Data
US 2022/0283743 A1   Sep. 8, 2022

Related U.S. Application Data (60) Provisional application No. 62/892,338, filed on Aug. 27, 2019.

(51) Int. Cl.
*G06F 3/06* (2006.01)
(52) U.S. Cl.
CPC .......... *G06F 3/0659* (2013.01); *G06F 3/0604* (2013.01); *G06F 3/0673* (2013.01)
(58) Field of Classification Search
CPC ..... G06F 3/0659; G06F 3/0604; G06F 3/0673
See application file for complete search history.

(56) References Cited

U.S. PATENT DOCUMENTS

| | | |
|---|---|---|
| 5,787,267 A | 7/1998 | Leung et al. |
| 5,959,929 A | 9/1999 | Cowles et al. |
| 6,603,683 B2 | 8/2003 | Hsu et al. |
| 6,647,456 B1 | 11/2003 | Van Dyke et al. |
| 6,880,056 B2 | 4/2005 | Kootstra |
| 7,299,324 B2 | 11/2007 | Shrader et al. |
| 7,500,075 B1 | 3/2009 | Garrett, Jr. |

(Continued)

OTHER PUBLICATIONS

Notification of Transmittal of the International Search Report and the Written Opinion of the International Searching Authority, or the Declaration with Mail Date Jan. 22, 2021 re: Int'l Appln. No. PCT/US2020/047850. 19 Pages.

*Primary Examiner* — Tracy A Warren
(74) *Attorney, Agent, or Firm* — Lance Kreisman; Peninsula Patent Group (57) ABSTRACT

Memory controllers, devices, modules, systems and associated methods are disclosed. In one embodiment, an integrated circuit (IC) dynamic random access memory (DRAM) device is disclosed. The IC DRAM device includes memory core circuitry organized into bank groups of storage cells, each bank group accessible via a corresponding bank group address. A command/address (C/A) interface receives C/A information defining a joint command. The joint command includes information specifying a first memory access operation, a first bank group address associated with the first memory access operation, and a second memory access operation to be automatically directed to the first bank group address.

20 Claims, 10 Drawing Sheets

(56) References Cited

U.S. PATENT DOCUMENTS

| | | |
|---|---|---|
| 7,549,033 B2 | 6/2009 | Choi et al. |
| 8,233,348 B2 | 7/2012 | Lee |
| 8,520,460 B2 | 8/2013 | Takano |
| 8,675,419 B2 | 3/2014 | Kajigaya et al. |
| 9,196,351 B2 | 11/2015 | Kajigaya et al. |
| 9,552,255 B2 | 1/2017 | Kim et al. |
| 10,133,493 B2 | 11/2018 | Weiner et al. |
| 2002/0013888 A1 | 1/2002 | Jeddeloh |
| 2002/0196669 A1* | 12/2002 | Hsu ............... G11C 11/406 365/189.04 |
| 2003/0188088 A1* | 10/2003 | Kootstra ........... G11C 7/1078 711/105 |
| 2012/0072787 A1 | 3/2012 | Bodrozic et al. |
| 2013/0176807 A1* | 7/2013 | Liu ............... G11C 11/4087 365/230.01 |
| 2014/0344546 A1 | 11/2014 | Ware et al. |
| 2014/0372682 A1* | 12/2014 | Benedict ............ G11C 16/26 711/103 |
| 2017/0286017 A1 | 10/2017 | Ware et al. |
| 2017/0351627 A1 | 12/2017 | Ware et al. |
| 2018/0267891 A1 | 9/2018 | Sheffler et al. |
| 2019/0138245 A1* | 5/2019 | Shin ............... G06F 3/0611 |
| 2019/0279696 A1* | 9/2019 | Kim ............... G11C 11/408 |
| 2020/0135248 A1* | 4/2020 | Kim ............... G11C 8/06 |

* cited by examiner

| FX | ACT | RAS/A16 | CAS/A15 | WE/A14 | BG0-2/DC BA0-1 | | A12/BC | A17,13,11 | A10/AP | A0-9 |
|---|---|---|---|---|---|---|---|---|---|---|
| WR1 | H | H | L | L | BG | BA | V | V | AP | CA |
| WR2 | H | H | L | L | Code | BA | V | V | AP | CA |
| RD1 | H | H | L | H | BG | BA | V | V | AP | CA |
| RD2 | H | H | L | H | Code | BA | V | V | AP | CA |
| ACT | L | | | | | | RA | | RA | |

| Code | 0 | 1 | 2 |
|---|---|---|---|
| Valid | 0 | 0 | 0 |
| Invalid | 1 | 1 | 1 |

| FX | ACT | RAS/A16 | CAS/A15 | WE/A14 | BG0-2/DC | BA0-1 | A12/BC | A17,13,11 | A10/AP | A0-9 |
|---|---|---|---|---|---|---|---|---|---|---|
| WR1 | H | H | L | L | BG | BA | V | V | AP | CA |
| WR2 | H | H | L | Code | | BA | V | V | AP | CA |
| RD1 | H | H | L | H | BG | BA | V | V | AP | CA |
| RD2 | H | H | L | Code | | BA | V | V | AP | CA |
| ACT | L | RA | | | BG | BA | | RA | | |

| Code | 0 | 1 | 2 | 3 | 4 | 5 | 6 | 7 |
|---|---|---|---|---|---|---|---|---|
| Valid | 0 | 0 | 0 | 0 | 0 | 0 | 0 | 0 |
| A EXOR B | 0 | WRB 1 | WRB 2 | RD 1 | RD 2 | 0 | 0 | 1 |
| A OR B | 0 | WRB 1 | WRB 2 | RD 1 | RD 2 | 0 | 1 | 0 |
| A AND B | 0 | WRB 1 | WRB 2 | RD 1 | RD 2 | 1 | 0 | 0 |
| Swap | 0 | WRB 1 | WRB 2 | RD 1 | RD 2 | 1 | 1 | 0 |
| Mask | 0 | WRB 1 | WRB 2 | RD 1 | RD 2 | 1 | 0 | 1 |
| Invalid | 1 | X | X | X | X | X | X | X |

702 Code
704 A EXOR B
706 A OR B
708 A AND B
710 Swap

# JOINT COMMAND DYNAMIC RANDOM ACCESS MEMORY (DRAM) APPARATUS AND METHODS

CROSS REFERENCES TO RELATED APPLICATIONS

This application is a national stage application of international application number PCT/US2020/47850, filed Aug. 25, 2020, which claims the benefit of U.S. Provisional Application No. 62/892,338, filed Aug. 27, 2019, all of which are incorporated by reference herein in their entirety.

TECHNICAL FIELD

The disclosure herein relates to memory systems, memory controllers, memory devices, and associated methods.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Memory devices, controllers, systems, and associated methods are disclosed. In one embodiment, an integrated circuit (IC) dynamic random access memory (DRAM) device is disclosed that includes a memory core organized into addressable bank groups. A command/address (C/A) interface receives C/A information from a memory controller that specifies a first memory access operation and a first bank group address associated with the first memory access operation. A second memory access operation is automatically directed to the first bank group address. By employing C/A interface circuitry configured to support a joint command mode of operation, command coding, for example, may be optimized while increasing data transfer bandwidth and performance for various applications.

Figure 1:
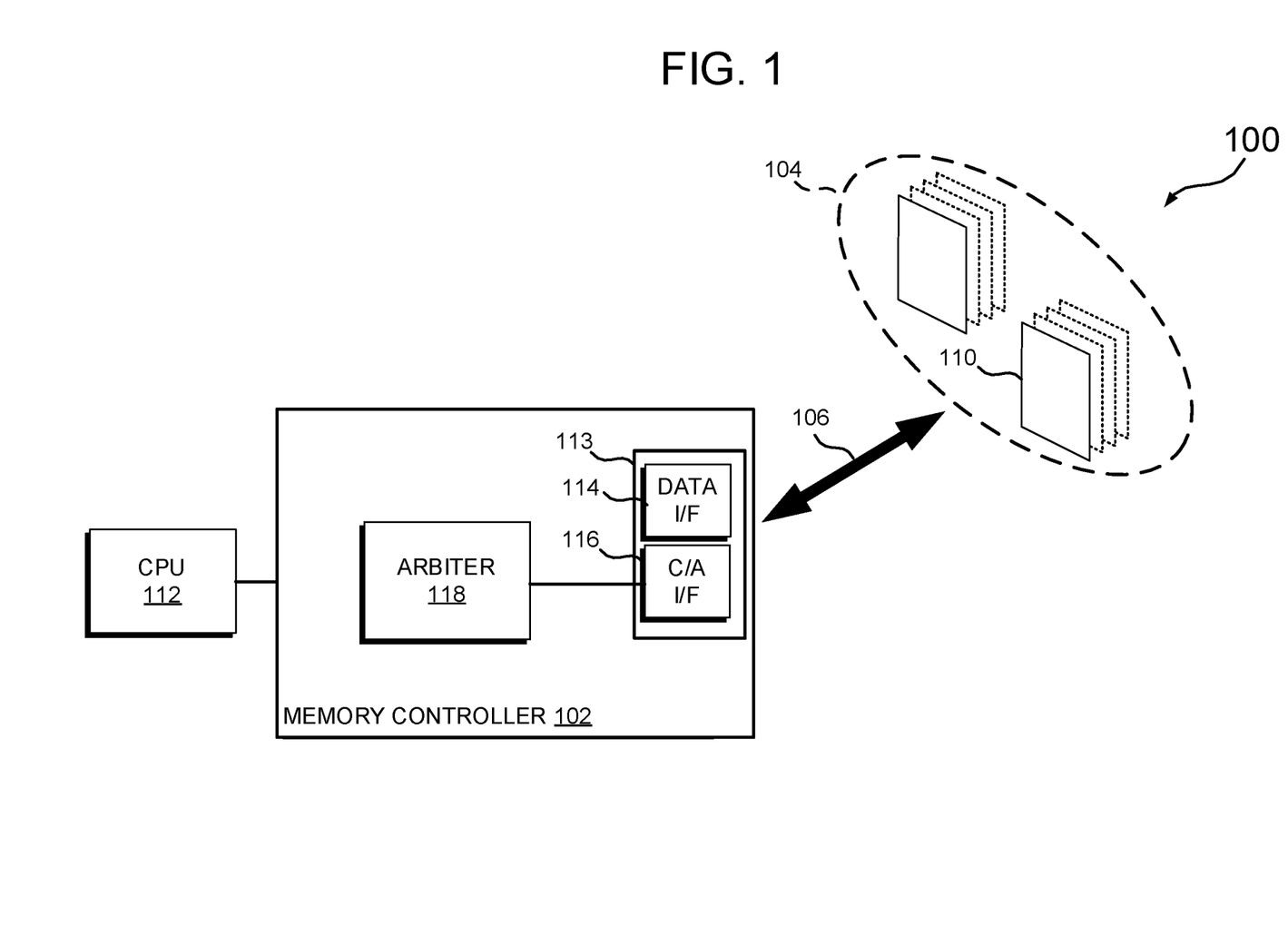
FIG. 1 illustrates one embodiment of a memory system that employs a memory controller, and at least one memory device component.

Referring now to FIG. 1, a memory system, generally designated 100, is shown that includes a memory controller 102 coupled to memory 104 via signaling media 106. For one embodiment, the memory controller 102 is a dynamic random access memory (DRAM) controller, with the memory 104 realized as one or more DRAM memory devices 110. In some embodiments, the memory controller 102 and memory devices 110 may be embodied as integrated circuits, or chips. Other embodiments may employ the memory controller as a circuit in a host central processing unit (CPU) 112. Specific embodiments for the DRAM memory controller 102 and memory 104 may be compliant with various DRAM standards, including double data rate (DDR) variants, low power (LPDDR) versions, and graphics (GDDR) types. Other embodiments may include multi-chip modules that, for example, employ stacked memory die, or stacked packages. Such embodiments may be used with the memory devices 110. Additional embodiments may stack memory die and logic die together in a common package, or in separate packages stacked upon each other.

Further referring to FIG. 1, the memory controller 102 includes a memory interface 113 with data interface circuitry 114 and command/address (C/A) interface circuitry 116. Additional interfaces may also be included to support additional memory channels, each with similar data and C/A interface circuits. A scheduler or arbiter 118 generates command, control, and address signals for controlling memory access operations. For one embodiment, explained below, the arbiter 118 generates joint commands for simultaneously accessing different banks within a common bank group. The simultaneous accesses result in significantly more data being transferred while preserving fine granularity for data threads.

Figure 2:
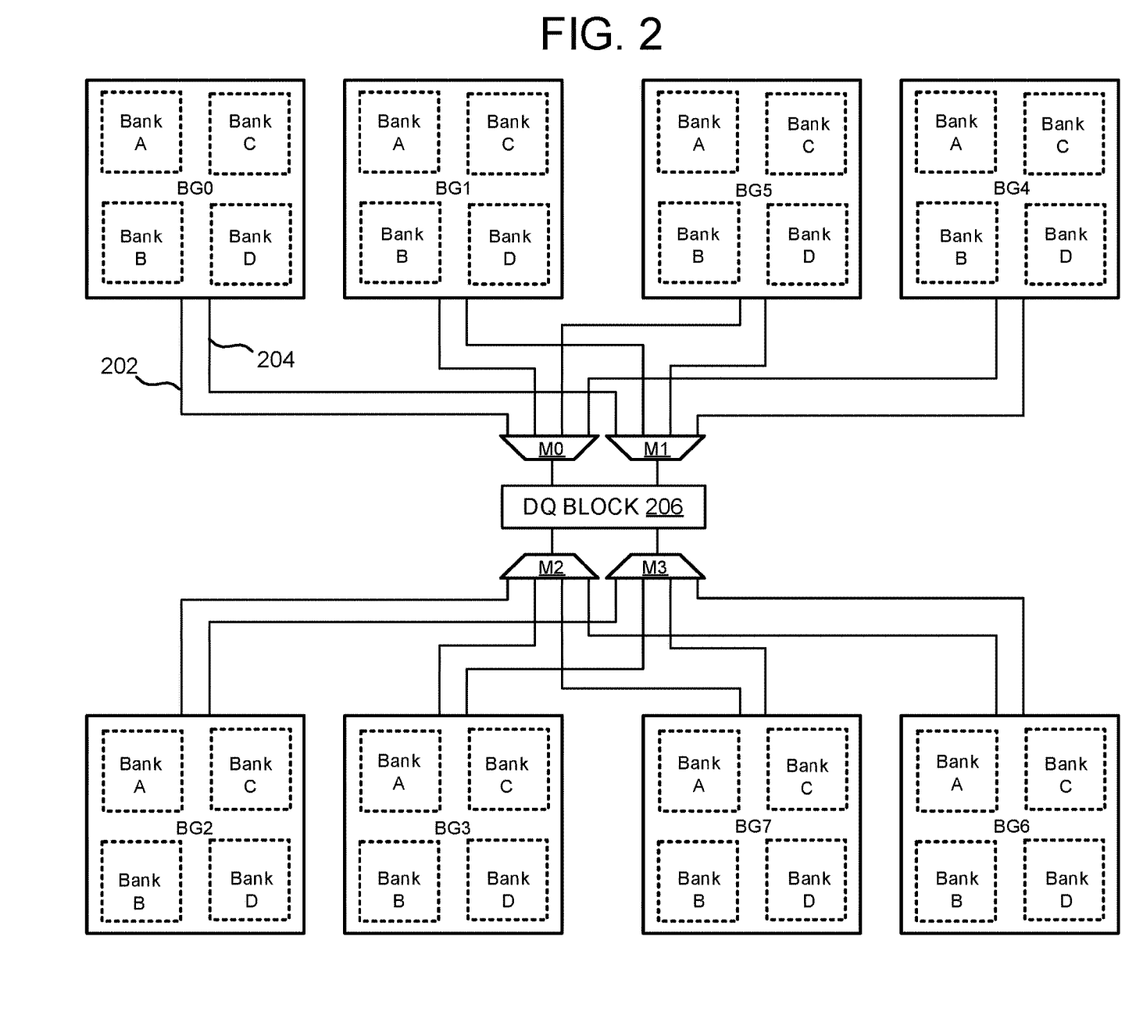
FIG. 2 illustrates one embodiment of a memory device component architecture for the memory device shown in FIG. 1.

FIG. 2 illustrates one embodiment of a dynamic random access memory (DRAM) device architecture capable of taking advantage of the joint command protocol utilized by the memory controller 102. The architecture includes multiple addressable bank groups BG0-BG7 of DRAM storage cells. Each bank group includes multiple addressable banks A-D. First and second burst data paths 202 and 204 are coupled to each bank group for simultaneously routing respective first and second 64 byte (B) bursts of data in response to a single joint command. Selection circuitry in the form of multiple multiplexers M0-M3 selectively apply coordinated first and second data bursts between a same bank group (associated with a given joint command) and a data input/output (I/O) circuit associated with DQ block 206.

Figure 3A:
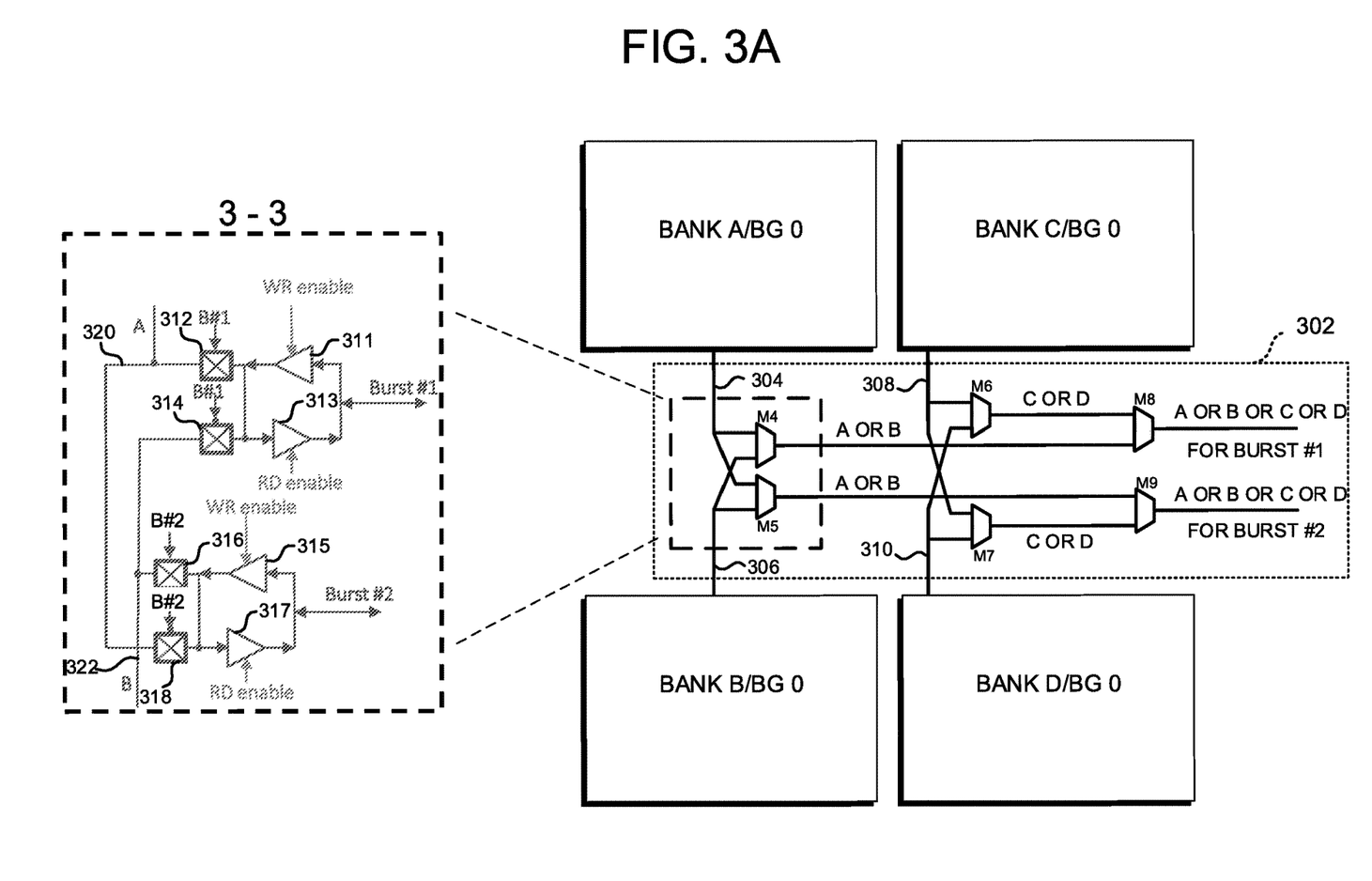
FIG. 3A illustrates further detail for one embodiment of a bank group architecture and routing arrangement for the memory device component of FIG. 3.

FIG. 3A illustrates further detail of bank selection circuitry, generally designated 302, for bank group BG0 of the bank groups of FIG. 2. Much of the discussion is described in terms of a read data flow, where accessed data is retrieved from a given bank and eventually routed to one of the burst paths 202 or 204. The bank group includes banks A, B, C and D (Bank A, Bank B, Bank C and Bank D) with respective internal data transfer paths 304, 306, 308 and 310. The transfer paths for banks A and B, at 304 and 306, are cross-coupled to a first pair of 2:1 multiplexers M4 and M5. In a similar manner, the transfer paths for banks C and D, at 308 and 310, are cross-coupled to a second pair of 2:1 multiplexers M6 and M7. The outputs (inputs for write operations) of multiplexers M4 and M6 are fed to a first burst multiplexer M8 to provide (or receive, in the case of write operations) first burst data to the first burst data path 202 (FIG. 2) associated with the bank group. The outputs of multiplexers M5 and M7 are fed to a second burst multiplexer M9 to provide second burst data to the second burst data path 204 (FIG. 2) associated with the bank group.

Further referring to FIG. 3A, further detail of the transfer paths for banks A and B, along with the first pair of multiplexers M4 and M5 are shown in close-up 3-3. Each of the multiplexers M4 and M5 include tri-stateable buffers 311, 313, 315 and 317. Tri-stateable buffers 311 and 315 transmit data from the respective first and second burst paths (Burst #1 and Burst #2) to the banks (Bank A or Bank B) in a write operation, and gated by write enable signals "WR enable." For read operations, tri-stateable buffers 313 and 317 receive data from banks A or B and forward the data to the respective burst paths, subject to being gated by signals "RD enable." Gating transistors 312, 314, 316 and 318 alternatingly provide a data transfer path along paths 320 (Bank A) or 322 (Bank B) for a given read/write access based on receipt of burst control signals B #1 (Burst 1) or B #2 (Burst 2) and their inverse values /B #1 and /B #2.

Figure 3B:
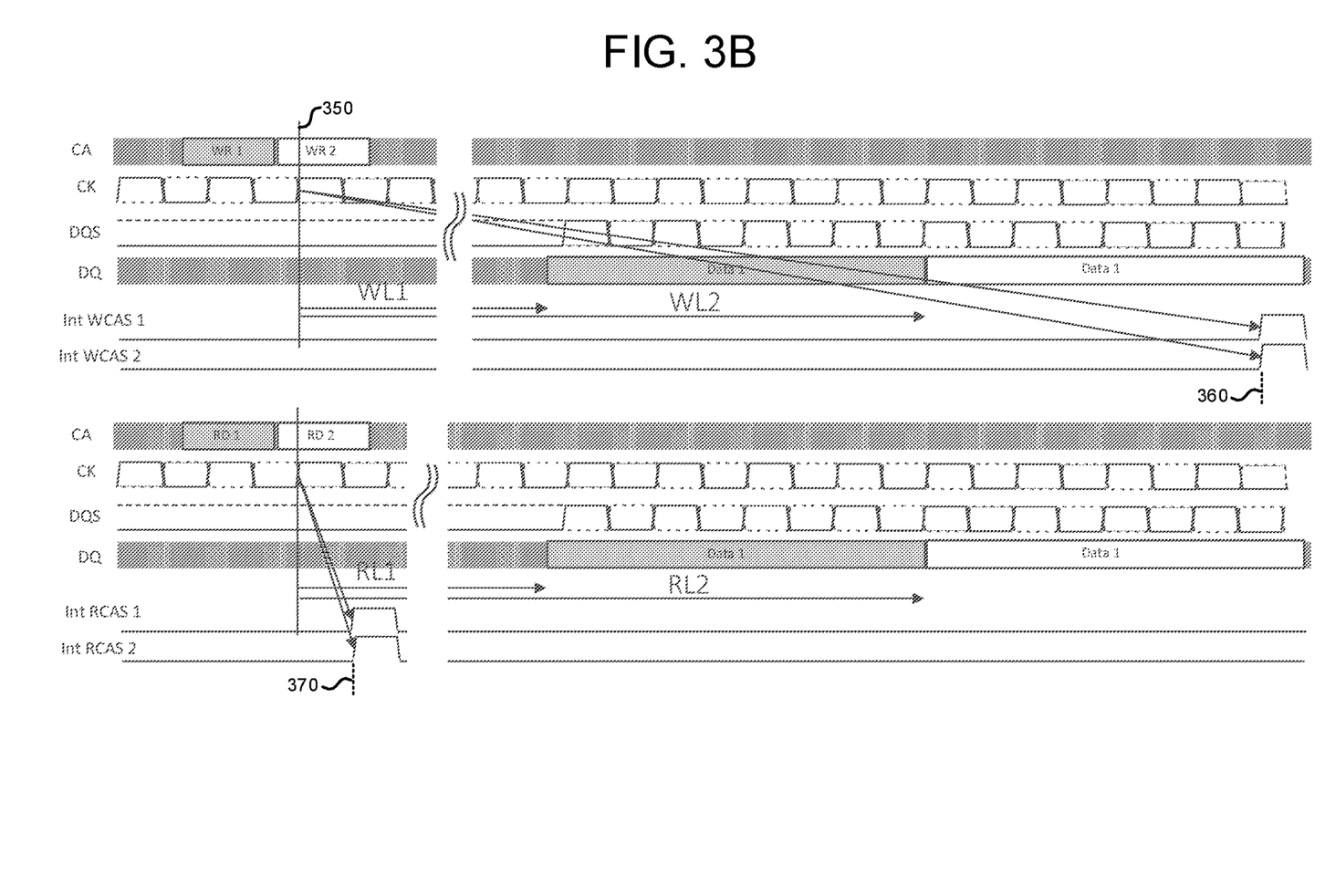
FIG. 3B illustrates various timings, including different write and read latencies associated with the bank group architecture of FIG. 3A.

For one embodiment, the read and write enable signals are queued and applied to the respective drivers/receivers in such a manner that the two accesses specified in the joint command are applied to the memory core and carried out by the separate banks in a near-simultaneous, or concurrent, manner. FIG. 3B illustrates various timings associated with a joint write operation involving write access signals WR1 and WR2, and a joint read operation, involving read access signals RD1 and RD2. For the joint write operation, the first write access signal WR1 is sent from the memory controller CA interface 116, followed immediately by the second write access signal WR2, at 350. After the first write latency interval WL1, (measured from the time the second access command WR2 is latched by the memory interface, at 350), write data "Data 1" is sent from the memory controller data interface 114. Second data "Data 2" corresponding to the second write access signal WR2 immediately follows the first data "Data 1", and exhibits a second write latency interval WL2. Once the second data "Data 2" has been received by the memory, both write accesses are simultaneously applied to the memory core, in response to internal Write Column Access Signals "Int WCAS 1" and "Int WCAS 2", at 360. The read access signals RD1 and RD2 are associated with similarly different read latencies RL1 and RL2, where a concurrent or simultaneous read access is triggered by the memory receiving the second read access signal RD2, and rising edges of internal Read Column Access Signals "Int RCAS 1" and "Int RCAS 2." For some embodiments, the concurrency, or simultaneous access to the two banks, involves having a first access occurring during a first time interval, and having the second access occurring during a second time interval that at least partially overlaps the first time interval.

Figure 4:
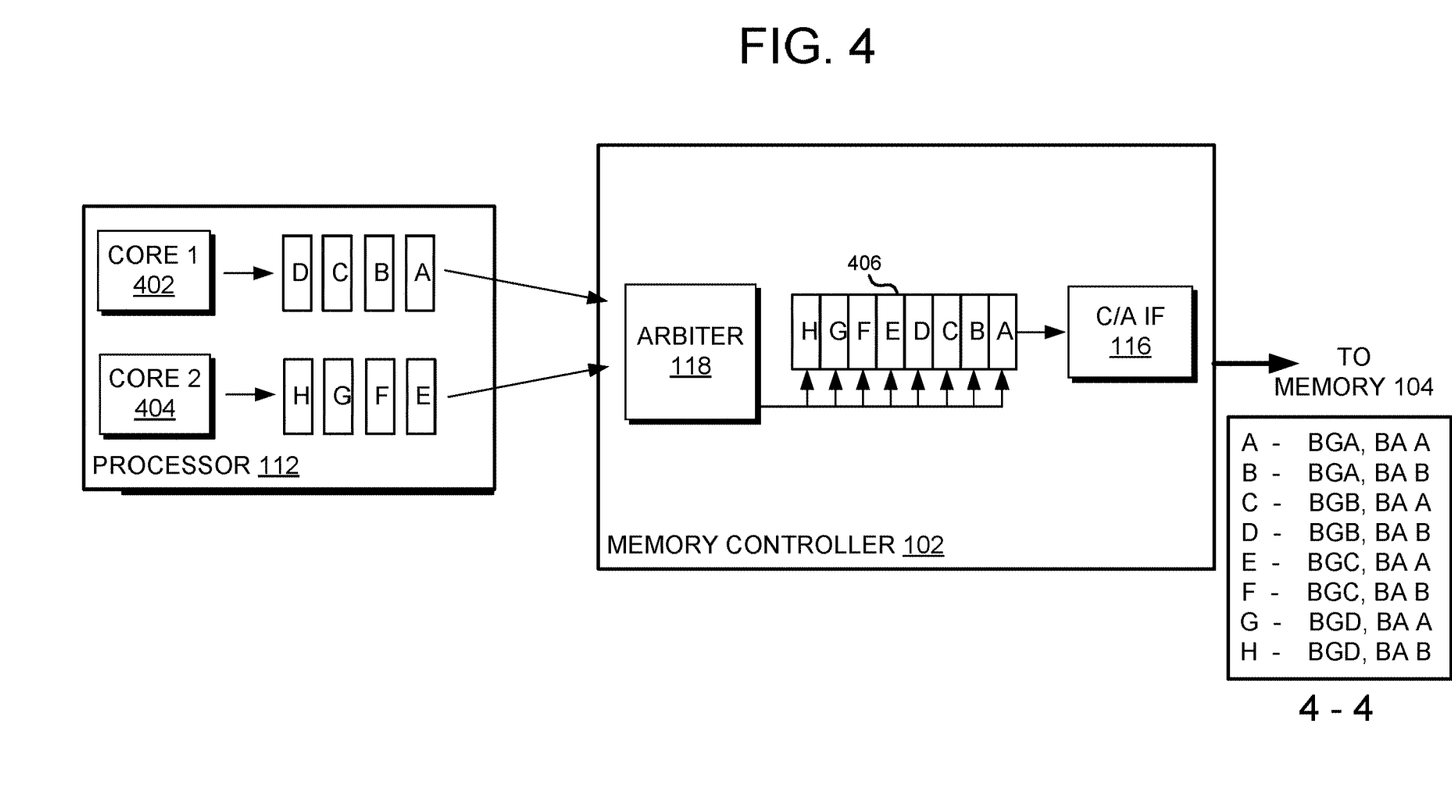
FIG. 4 illustrates one embodiment of the CPU and memory controller, shown in FIG. 1, in operation.

Referring now to FIG. 4, in operation, the host processor 112 may include multiple cores 402 and 404 that generate various requests that may be in a first (arbitrary) order involving data that, for one embodiment, are in 64B data threads identified by A-H. The requests are sent to the memory controller 102, and organized and prioritized by the arbiter 118 into a queue 406. When operating in a joint command mode, the organization of the queue 406 takes advantage of the DRAM architecture described previously so that simultaneous accesses may be made to different banks within a common bank group in response to a single joint command. This allows for an aggregate data access of 128 B that simultaneously satisfies two of the 64 B data thread requests while preserving the relatively fine 64 B granularity of the data threads.

Further referring to FIG. 4, and specifically to Table 4-4, for one embodiment, the memory controller queue 406 is organized with data threads "A" and "B" being directed to banks A (BA A) and B (BA B) of bank group A (BGA) for a first dual access in response to a first joint command. A subsequent joint command is then dispatched for data threads "C" and "D", which is directed to banks A and B of bank group B. The other bank groups are subsequently accessed in a rotating fashion, as shown in Table 4-4 of FIG. 4, with successive joint commands.

Figure 5:
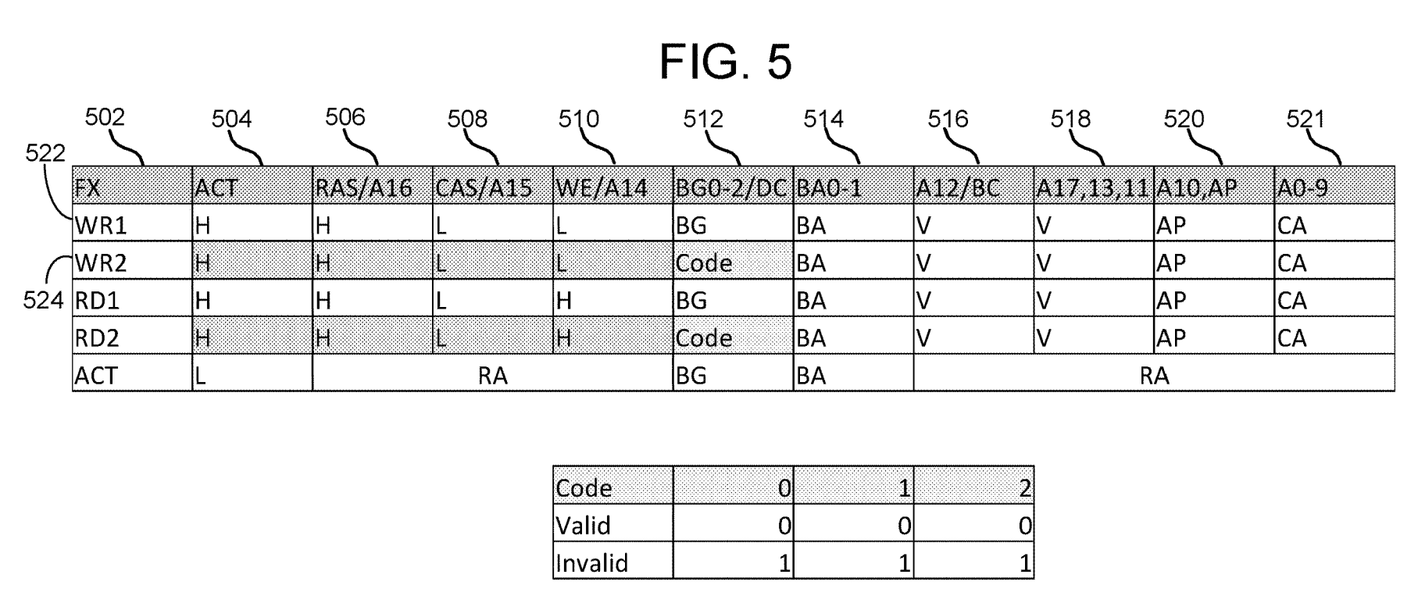
FIG. 5 illustrates one embodiment of a truth table corresponding to the memory device component of FIG. 2.

FIG. 5 illustrates one embodiment of a command truth table for carrying out the joint command protocol described above. The top row of the table, at 502, generally identifies one or more functions associated with a given field (each column) of one or more bits of a command/address (C/A) word dispatched from the memory controller each clock cycle (each row). The information fields generally correspond to an activate signal ACT, at 504, a row address strobe signal RAS, at 506, a column address strobe signal CAS, at 508, a write enable signal WE, at 510, bank group address bits BG0-2, at 512, bank address bits BA0-1, at 514, and other various control and address bits typically specified by various double data rate (DDR) DRAM standards, at 516, 518, 520 and 521.

Further referring to FIG. 5, the second and third rows of C/A information, at 522 and 524, provide sufficient command, control and address information, as a single joint command, to carry out simultaneous write accesses WR1 and WR2 to two different banks within a single bank group. The second row of information corresponds to the first write access WR1 directed to a particular bank group, via bank group address information, at 512, and to a particular bank, via bank address information, at 514. During an immediately subsequent clock cycle, the DRAM receives C/A information corresponding to the third row, at 524, corresponding to the second write access WR2. In some embodiments, the second and third rows of CA information, at 522 and 524, may be timed by subsequent edges of a single clock cycle, such as in a Double Data Rate (DDR) configuration. For one embodiment, the second write access occurs automatically, within the same bank group, as a feature of the joint command protocol. Further, in some embodiments, the automatic access is of the same type as the preceding access, so that write operations occur back-to-back as do read operations. As a result of the second access occurring automatically, write command encoding for the second write access, typically comprising 7 bits of encoding space, and usually provided via the ACT, RAS, CAS, WE and BG fields 504, 506, 508, 510 and 512, is redundant, or unnecessary.

Since the second write command WR2 occurs automatically following the first write command WR1, and any encoding for the second write access is unnecessary, those fields that would ordinarily provide the write encoding information are free to provide auxiliary or alternative coded information. For one embodiment, the alternative coded information may include valid/invalid information concerning the write encoding fields 504, 506, 508 or 510 (whether any provided information is valid or not). In another embodiment, described more fully below, the alternative coded information may include atomic commands that enable logic in the DRAM to process accessed data in specified ways before the operations corresponding to the accesses are completed.

For another embodiment, the alternative coded information may include "on-the-fly" mode control information specifying, for example, that the DRAM is to be operating in a mode that supports the joint command protocol. In other embodiments, the DRAM may employ a mode register (not shown) that statically stores a mode value indicating that the DRAM is to be operating in the joint command mode.

Figure 6:
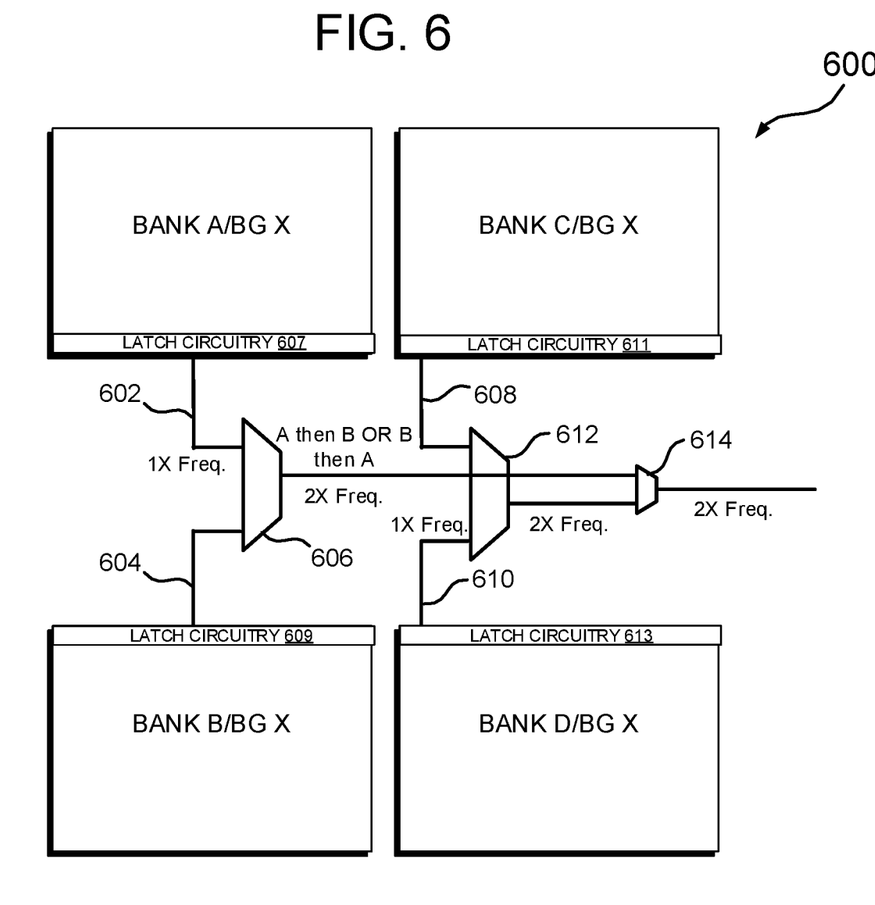
FIG. 6 illustrates a further embodiment of a bank group architecture and routing arrangement for the memory device component of FIG. 2.

While the DRAM architecture described above with respect to FIGS. 3 and 4 is able to carry out simultaneous accesses to different banks of a same bank group in a spatial manner, (incorporating additional routing paths for routing the additional accessed data), a further embodiment, shown in FIG. 6, supports the simultaneous accesses in a temporal manner (enabling data threads to share time intervals in a time-multiplexed manner).

FIG. 6 illustrates an alternative embodiment of a bank group architecture, generally designated 600. The bank group includes multiple addressable banks Bank A, Bank B, Bank C and Bank D. Respective data burst paths corresponding to banks A and B, at 602 and 604, are coupled to a first multiplexer 606. Each bank includes latch circuitry 607, 609, 611 and 613 that holds data accesses corresponding to a second time slot for a half clock cycle. For one embodiment, the latch circuitry may be incorporated into a secondary sense amplifier row of each bank. The inputs to the first multiplexer 606 are clocked at a system clock frequency F, while the output of the first multiplexer 606 is clocked at a frequency that is twice the input clock frequency 2F. Data from the two inputs may then be passed to the output in one of several different ways, but within a time interval corresponding to the clock frequency F. Banks C and D are coupled to similarly formed data burst paths 608 and 610 and to a second multiplexer 612. The inputs to the second multiplexer are clocked at the system clock frequency F, while the output of the second multiplexer is clocked at twice the input clock frequency 2F, with data from the two inputs sharing a time interval corresponding to the clock frequency F (time interval of 1/F). A third multiplexer 614 receives the time-shared data bursts from each of the first and second multiplexer outputs, and selectively transfers each burst during different portions of the timing interval 1/F.

Figure 7:
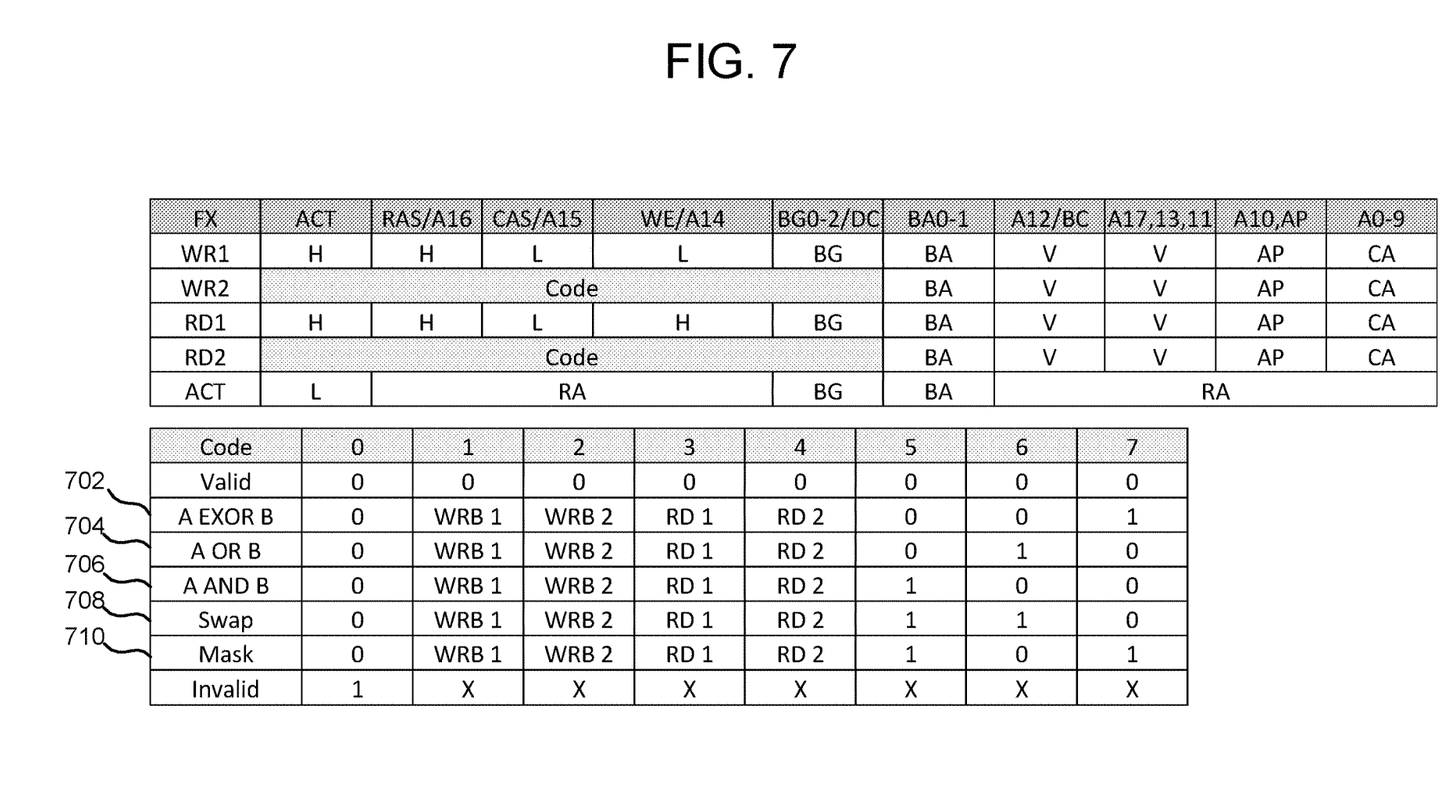
FIG. 7 illustrates a truth table similar to FIG. 5, and including fields for atomic-coded operations.

FIG. 7 illustrates a further embodiment of a command truth table similar to the embodiment shown in FIG. 5. The rows and columns generally correspond to that shown in FIG. 5, but further coding is provided as a substitute for the redundant coding associated with the automatic read/write operation as a result of the joint command protocol. Specifically, the alternate coding in one embodiment specifies atomic operations that may be performed on the simultaneously accessed data threads by additional logic included in the DRAM, described more fully below.

Further referring to FIG. 7, for one embodiment, at least seven extra bits of coding space are available when operating in the joint command mode. The seven extra bits made available by the redundant second operation code may be encoded in a variety of ways to specify at least one of several different atomic operations. For example, row 2 of the "Code" table, at 702, specifies an "A EXOR B" operation with a bit coding of 0,0,1 in bit positions 5, 6 and 7. Rows 3-6, at 704, 706, 708, and 710 provide different operations by coding the same bit positions (5, 6 and 7) differently.

Figure 8:
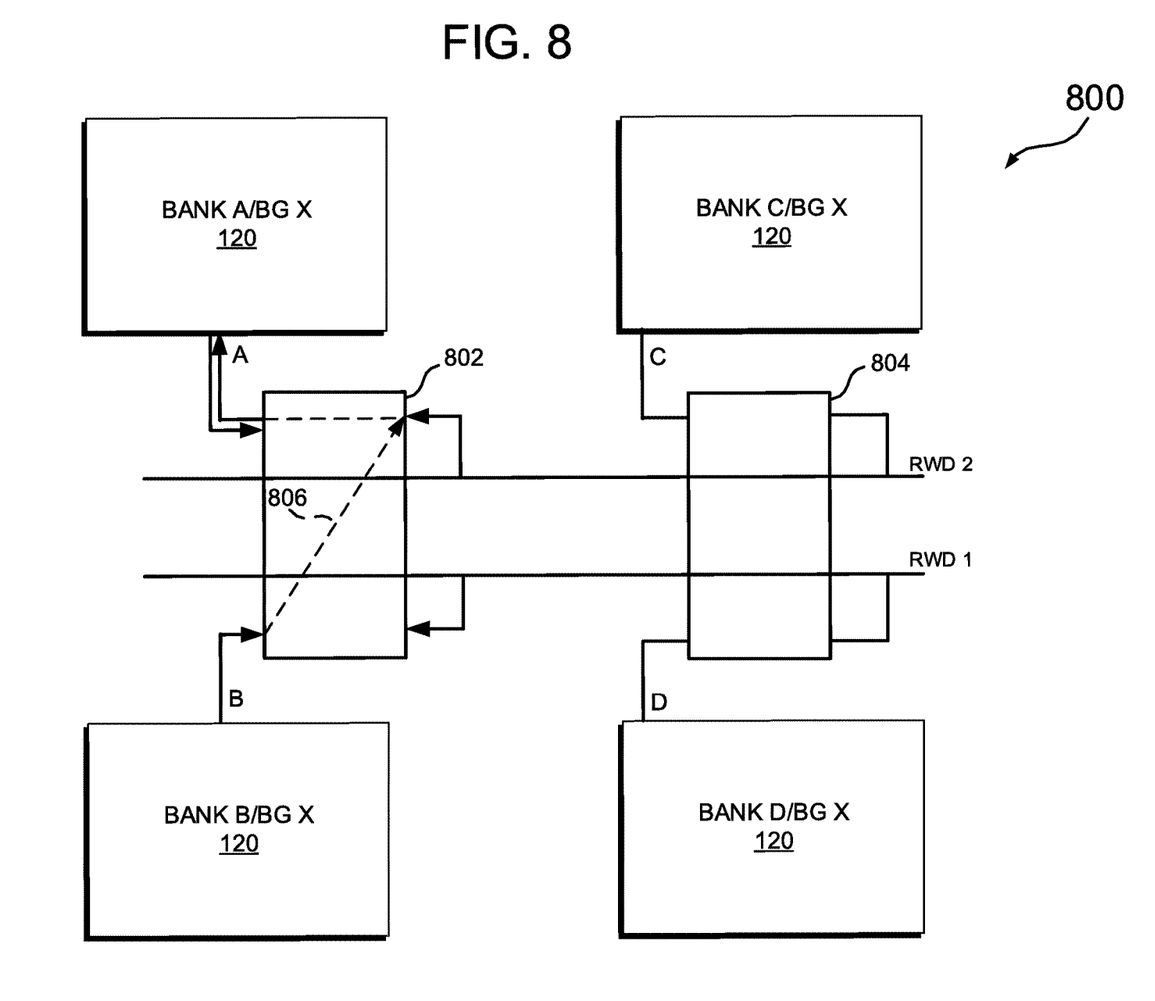
FIG. 8 illustrates one embodiment of bitwise atomic operator logic that carries out a Copy operation.

FIG. 8 illustrates one example of a DRAM bank group architecture capable of carrying out atomic operations such as those coded above in the command truth table of FIG. 7. For one embodiment, a first bitwise atomic operator circuit 802 is incorporated between two banks, Bank A and Bank B, and a second atomic operator circuit 804 is formed between Bank C and Bank D. To carry out a "COPY" operation between banks B and A, the coding of FIG. 7 may specify, for example, a SWAP operation, at 708 (FIG. 7), which would involve writing an accessed 64B thread of data from bank B to bank A, along path 806, and a write-back of the copied data thread back to Bank B.

Figure 9:
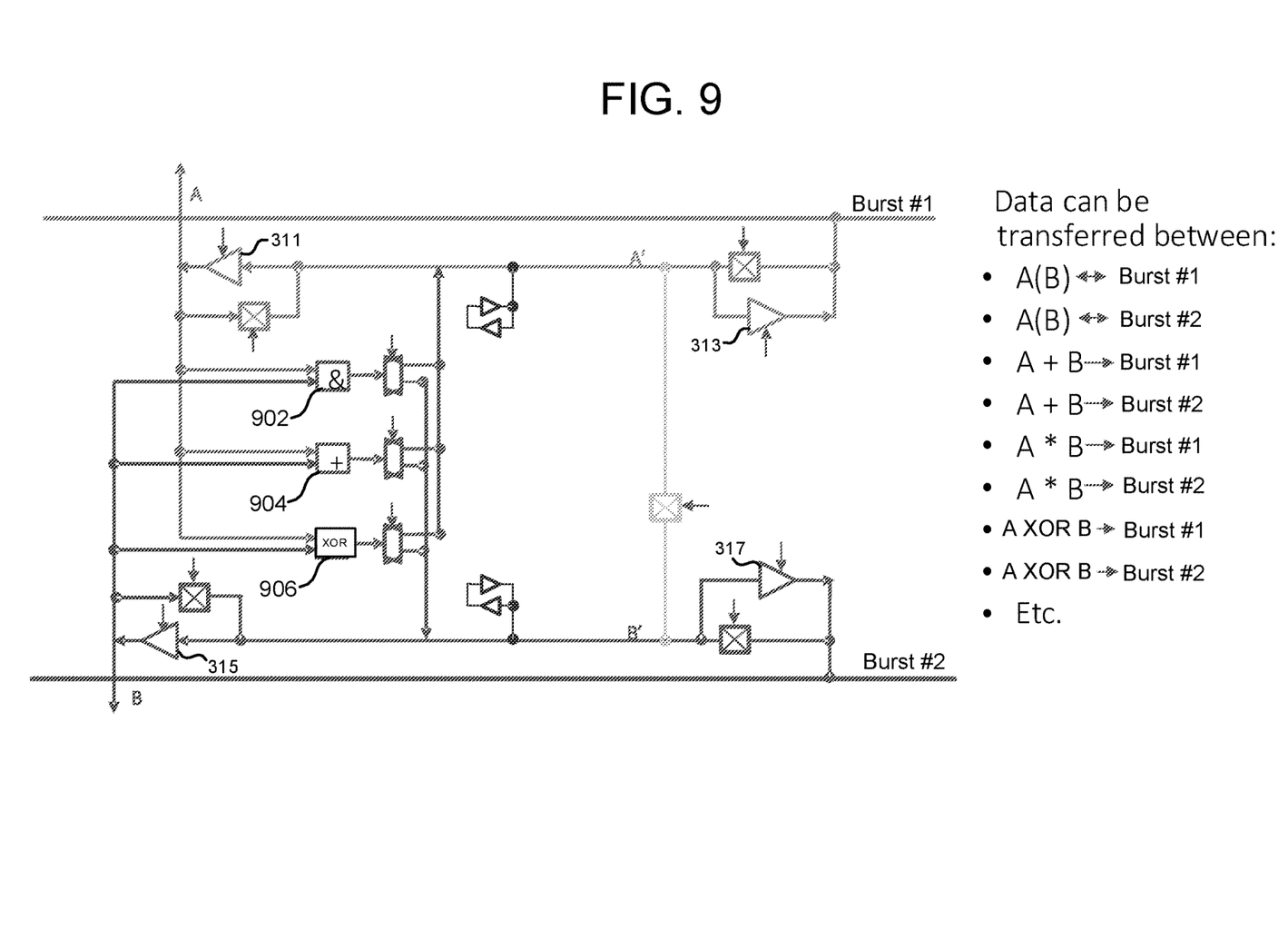
FIG. 9 illustrates further detail of one embodiment of the bitwise atomic operator logic of FIG. 8.

FIG. 9 illustrates one embodiment of an atomic operator circuit used in FIG. 8, employing multiple operators such as an AND operator, at 902, an OR operator, at 904, and an XOR operator, at 906.

Those skilled in the art will appreciate the joint command protocol and associated DRAM architecture described above. By simultaneously accessing different banks within a common bank group in response to a single joint command, significantly more data may be accessed while maintaining fine data thread granularity. Additionally, by optimizing the joint command protocol, enhanced coding may be applied in the command/address coding stream to optimize transfer operations.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. An integrated circuit (IC) dynamic random access memory (DRAM) device, comprising:
    memory core circuitry organized into bank groups of storage cells, each bank group accessible via a corresponding bank group address; and
    a command/address (C/A) interface to receive C/A information defining a joint command, the joint command including information specifying
        a first memory access operation with command encoding corresponding to the first memory access operation,
        a first bank group address associated with the first memory access operation, and
        a second memory access operation to be automatically directed to the first bank group address without command encoding corresponding to the second memory access operation.

2. The IC DRAM device of claim 1, wherein:
the first bank group address is specified solely once for both the first memory access operation and the second memory access operation.

3. The IC DRAM device of claim 1, wherein:
the information specifying the first memory access operation is received during a first C/A interface clock cycle; and
the information specifying the second memory access operation is received during a second C/A interface clock cycle immediately following the first C/A interface clock cycle.

4. The IC DRAM device of claim 3, wherein:
the C/A interface includes input/output (I/O) pin circuitry to receive the C/A information;
wherein during the first C/A interface clock cycle, a set of I/O pins assigned to receive bank group address information receives the first bank group address; and
wherein during the second C/A interface clock cycle, the set of I/O pins receives coded information corresponding to an auxiliary operation.

5. The IC DRAM device of claim 4, wherein:
the coded information includes a code representing a valid/invalid state to confirm the auxiliary operation.

6. The IC DRAM device of claim 5, wherein:
the auxiliary operation includes an atomic operation.

7. The IC DRAM device of claim 6, further comprising:
a data interface to transfer first data associated with the first memory access operation and second data associated with the second memory access operation; and
wherein the atomic operation comprises a copy operation involving at least a portion of the first data and a portion of the second data.

8. The IC DRAM device of claim 1, wherein:
the first and second memory access operations are executed concurrently.

9. The IC DRAM device of claim 8, wherein:
the first memory access operation is executed during a first time interval; and
the second memory access operation is executed during a second time interval that at least partially overlaps the first time interval.

10. The IC DRAM device of claim 1, wherein the joint command further comprises:
a first bank address associated with the first memory access; and
a second bank address associated with the second memory access that is different than the first bank address.

11. The IC DRAM device of claim 1, wherein each of the bank groups of storage cells further comprise:
multiple banks configured to transfer data associated with the first memory access and the second memory access along respective data paths concurrently.

12. The IC DRAM device of claim 1, wherein each of the bank groups of storage cells further comprise:
multiple banks configured to transfer data associated with the first memory access and the second memory access along a common data path during respective portions of a transfer interval.

13. A method of operation in an integrated circuit (IC) dynamic random access memory (DRAM) device, the IC DRAM device including memory core circuitry organized into bank groups of storage cells, each bank group accessible via a corresponding bank group address, the method comprising:
    receiving command/address (C/A) information defining a joint command via a C/A interface, the joint command including information specifying
        a first memory access operation with command encoding corresponding to the first memory access operation,
        a first bank group address associated with the first memory access operation, and
        a second memory access operation to be automatically directed to the first bank group address without command encoding corresponding to the second memory access operation.

14. The method of claim 13, wherein:
the information specifying the first bank group address is specified solely once for both the first memory access operation and the second memory access operation.

15. The method of claim 13, wherein the receiving the C/A information comprises:

receiving the information specifying the first memory access operation during a first C/A interface clock cycle; and receiving the information specifying the second memory access operation during a second C/A interface clock cycle immediately following the first C/A interface clock cycle.

16. The method of claim 15, wherein the C/A interface includes input/output (I/O) pin circuitry to receive the C/A information, and wherein receiving the C/A information comprises:

receiving the first bank group address during the first C/A interface clock cycle via a first set of I/O pins assigned to receive bank group address information; and receiving coded information corresponding to an auxiliary operation during the second C/A interface clock cycle via the first set of I/O pins.

17. The method of claim 13, further comprising:

executing the first and second memory access operations by spatially transferring corresponding first data and second data along respective data paths concurrently.

18. The method of claim 13, further comprising:

executing the first and second memory access operations by temporally transferring corresponding first data and second data along a common data path during respective portions of a transfer interval.

19. A dynamic random access memory (DRAM) device, comprising:

a command/address (C/A) interface to receive C/A information defining a joint command, the C/A interface including a first set of input/output (I/O) pins to receive a first portion of the joint command during a first C/A interface clock cycle, the first portion of the joint command specifying a first memory access operation;

a second set of I/O pins to receive a second portion of the joint command during the first C/A interface clock cycle, the second portion of the joint command specifying a bank group address associated with the first memory access operation;

wherein during a second C/A interface clock cycle, the first set of I/O pins receives a third portion of the joint command, the third portion of the joint command specifying a second memory access operation; and wherein during the second C/A interface clock cycle, the second set of I/O pins receives a fourth portion of the joint command, the fourth portion of the joint command specifying an auxiliary operation.

20. The DRAM device of claim 19, wherein:

the second memory access operation is automatically associated with the first bank group address without the joint command specifying the bank group address during the second C/A interface clock cycle.

* * * * *